(12) United States Patent
Ikoshi et al.

(10) Patent No.: US 10,475,802 B2
(45) Date of Patent: Nov. 12, 2019

(54) SEMICONDUCTOR DEVICE

(71) Applicant: Panasonic Intellectual Property Management Co., Ltd., Osaka (JP)

(72) Inventors: Ayanori Ikoshi, Kyoto (JP); Manabu Yanagihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/812,525

(22) Filed: Nov. 14, 2017

(65) Prior Publication Data

US 2018/0102426 A1    Apr. 12, 2018

Related U.S. Application Data

(63) Continuation of application No. PCT/JP2016/002419, filed on May 18, 2016.

(30) Foreign Application Priority Data

May 19, 2015    (JP) .................................. 2015-102289

(51) Int. Cl.
*H01L 27/11517*    (2017.01)
*H01L 29/423*    (2006.01)
(Continued)

(52) U.S. Cl.
CPC .... *H01L 27/11517* (2013.01); *H01L 29/0649* (2013.01); *H01L 29/42316* (2013.01);
(Continued)

(58) Field of Classification Search
USPC ........................................................ 257/213
See application file for complete search history.

(56) References Cited

U.S. PATENT DOCUMENTS

2008/0149940 A1    6/2008    Shibata et al.
2012/0049244 A1    3/2012    Imada et al.
(Continued)

FOREIGN PATENT DOCUMENTS

JP    2002-359256 A    12/2002
JP    2008-177527 A    7/2008
(Continued)

OTHER PUBLICATIONS

International Search Report issued in Application No. PCT/JP2016/002419 dated Aug. 16, 2016, with English translation.

*Primary Examiner* — Nilufa Rahim
(74) *Attorney, Agent, or Firm* — McDermott Will & Emery LLP

(57) ABSTRACT

A semiconductor device includes: a substrate; a first nitride semiconductor layer and a second nitride semiconductor layer having a band gap wider than a band gap of the first nitride semiconductor layer; a first active region which includes a source electrode, a drain electrode, and a gate electrode, and has a first carrier layer located in the first nitride semiconductor layer; and a second active region which is on an extension of a long-side direction of the drain electrode and has a second carrier layer located in the first nitride semiconductor layer via an element isolation region, and a potential of the second carrier layer is substantially same as a potential of a source extraction electrode in the second active region or is an intermediate potential between a potential of a gate extraction electrode and the potential of the source extraction electrode opposite a short side of the drain electrode.

19 Claims, 11 Drawing Sheets

(51) Int. Cl.
   *H01L 29/778*   (2006.01)
   *H01L 29/06*    (2006.01)
   *H01L 29/417*   (2006.01)
   *H01L 29/20*    (2006.01)

(52) U.S. Cl.
   CPC ...... *H01L 29/7786* (2013.01); *H01L 29/2003* (2013.01); *H01L 29/41725* (2013.01)

(56) References Cited

U.S. PATENT DOCUMENTS

| | | |
|---|---|---|
| 2012/0228632 A1 | 9/2012 | Takada et al. |
| 2015/0171204 A1* | 6/2015 | Nakayama .......... H01L 29/0649 257/20 |

FOREIGN PATENT DOCUMENTS

| | | |
|---|---|---|
| JP | 2012-119625 A | 6/2012 |
| JP | 2012-190980 A | 10/2012 |

* cited by examiner

PRESENT DISCLOSURE

SEMICONDUCTOR DEVICE

CROSS REFERENCE TO RELATED APPLICATIONS

This application is a U.S. continuation application of PCT International Patent Application Number PCT/JP2016/002419 filed on May 18, 2016, claiming the benefit of priority of Japanese Patent Application Number 2015-102289 filed on May 19, 2015, the entire contents of which are hereby incorporated by reference.

BACKGROUND

1. Technical Field

The present disclosure relates to a semiconductor device, and particularly to a field effect transistor.

2. Description of the Related Art

Group III-V nitride based compound semiconductors typified by gallium nitride (GaN), so-called a nitride semiconductor, has been attracting attention. A nitride semiconductor is a compound semiconductor expressed by the following general expression: $In_xGa_yAl_{1-x-y}N$ ($0 \le x \le 1$, $0 \le y \le 1$, $x+y \le 1$), and includes: aluminum (Al), gallium (Ga), and indium (In) included in group-III elements; and nitrogen (N) included in group-V elements. The nitride semiconductor makes it possible to form various mixed crystals, and easily form a heterojunction interface. A heterojunction of a nitride semiconductor has the following characteristics: a high-concentration two-dimensional electron gas layer (2DEG layer) is generated at a junction interface by spontaneous polarization or piezoelectric polarization even in a state without doping. Therefore, it becomes possible to manufacture a high-breakdown and miniaturized device making use of characteristics of the material having not only a wide band gap of 3.4 (eV) but also a high breakdown field of 3.3 (MV/cm). A field effect transistor (FET) using this high-concentration 2DEG layer as a carrier has been attracting attention as a device for high frequency, high speed, and large current.

A field effect transistor using a nitride semiconductor can be device-designed to be smaller in size as compared with a field effect transistor using silicon (Si). On the other hand, because of the small parasitic capacitance, there are problems such as self turn-on erroneous ignition and low static electricity resistance.

Japanese Unexamined Patent Application Publication No. 2012-119625 discloses a semiconductor device which includes means for suppressing self turn-on. FIG. 19 is a schematic plan view of the semiconductor device described in Japanese Unexamined Patent Application Publication No, 2012-119625. The semiconductor device described in Japanese Unexamined Patent Application Publication No, 2012-119625 has a structure in which a distance between gate pad 810 and source pad 811 which are disposed via non-element isolation region 820 is smaller than a distance between gate pad 810 and drain pad 812 which are disposed via non-element isolation region 819. Specifically, the self turn-on is suppressed by adding the gate-source capacitance Cgs between gate pad 810 and source pad 811 and thus reducing the gate-drain capacitance Cgd/gate-source capacitance Cgs ratio.

SUMMARY

The semiconductor device disclosed in Japanese Unexamined Patent Application Publication No. 2012-119625 can increase the gate-source capacitance Cgs, however, there is the following problem.

Japanese Unexamined Patent Application Publication No. 2012-119625 discloses, for example, a method of forming an active region including a 2DEG layer between gate pad 810 and source pad 811. However, with the method that only increases the gate-source capacitance Cgs, self turn-on can be suppressed but the gate-source charge quantity (Qgs) increases. Therefore, the gate drive loss and switching delay time also increase. Accordingly, there is a limit to the measure for suppressing self turn-on by only increasing the gate-source capacitance Cgs.

The present disclosure has been conceived to solve the above-described problem, and has an object to provide a semiconductor device which can operate a field effect transistor at high speed without malfunction and has high electrostatic resistance.

In order to solve the above-described problem, a semiconductor device according to an aspect of the present disclosure includes: a substrate; a semiconductor layer stacked body including a first nitride semiconductor layer above the substrate and a second nitride semiconductor layer which is on the first nitride semiconductor layer and has a band gap wider than a band gap of the first nitride semiconductor layer; a gate electrode on the semiconductor layer stacked body; a source electrode and a drain electrode located on opposite sides of the gate electrode and spaced apart from the gate electrode in a plan view of the semiconductor layer stacked body; a first active region which includes the source electrode, the drain electrode and the gate electrode in the plan view, and has a first carrier layer located in the first nitride semiconductor layer; a second active region which is on an extension of a long-side direction of the drain electrode in the plan view, and has a second carrier layer located in the first nitride semiconductor layer via an element isolation region containing no carrier; a gate extraction electrode located opposite a short side of the drain electrode in a plan view of the second active region and electrically connected with the gate electrode; and a source extraction electrode on the semiconductor layer stacked body in the second active region and electrically connected with the source electrode, and a potential of the second carrier layer is substantially same as a potential of the source extraction electrode or is an intermediate potential between a potential of the gate extraction electrode and the potential of the source extraction electrode.

With the semiconductor device according to the present disclosure, it is possible to realize a semiconductor device which can operate a field effect transistor at high speed without malfunction and has high electrostatic resistance.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Embodiment 1

Hereinafter, Embodiment 1 will be described with reference to the Drawings.

Figure 1A:
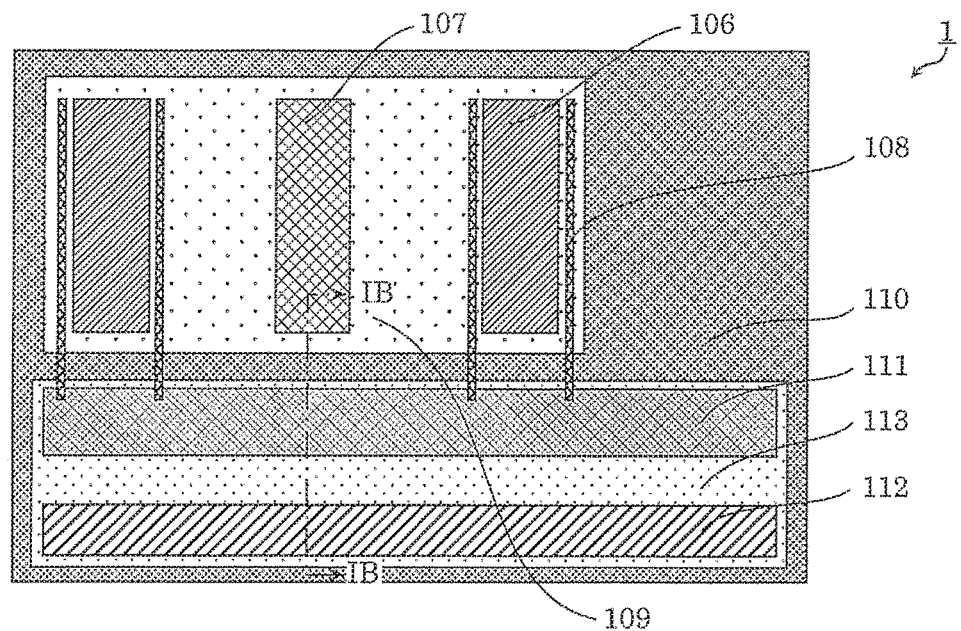
FIG. 1A is a schematic plan view of a nitride semiconductor device according to Embodiment 1.
Figure 1B:
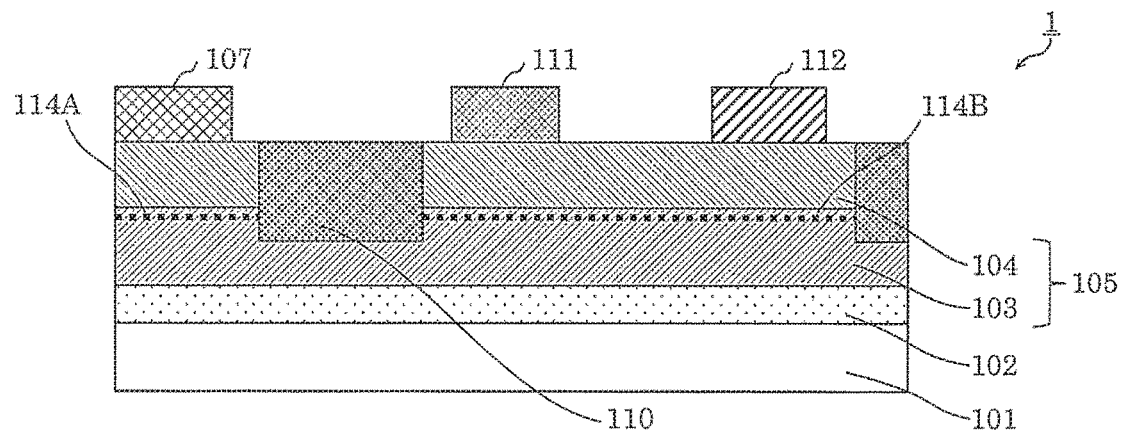
FIG. 1B is a schematic cross-sectional view of the nitride semiconductor device according to Embodiment 1.

FIG. 1A is a schematic plan view of nitride semiconductor device 1 according to Embodiment 1, and FIG. 1B is a schematic cross-sectional view of nitride semiconductor device 1 according to Embodiment 1. Specifically, FIG. 1B illustrates a cross-sectional view, at an IB-IB line, of FIG. 1A.

As illustrated in FIGS. 1A and 1B, semiconductor device 1 according to the present embodiment includes substrate 101, buffer layer 102, first nitride semiconductor layer 103, second nitride semiconductor layer 104, source electrode 106, drain electrode 107 and gate electrode 108, gate extraction electrode 111, and source extraction electrode 112.

Substrate 101 is, for example, a substrate including silicon.

Buffer layer 102 is on substrate 101 and is a superlattice layer.

First nitride semiconductor layer 103 is a GaN layer which is on buffer layer 102 and has a thickness of approximately 2 µm, for example.

Second nitride semiconductor layer 104 is an AlGaN layer which is on first nitride semiconductor layer 103 and has a thickness of approximately 50 nm, for example.

In first nitride semiconductor layer 103, at an interface region with second nitride semiconductor layer 104, two-dimensional electron gas (2DEG) is generated and there is a channel region having carrier layer 114 (collective term for first carrier layer 114A and second carrier layer 114B illustrated in FIG. 1B). First nitride semiconductor layer 103 and second nitride semiconductor layer 104 constitute semiconductor layer stacked body 105.

Furthermore, as illustrated in FIG. 1A, semiconductor device 1 includes, in a plan view of semiconductor layer stacked body 105, first active region 109 having a transistor function, and second active region 113 spaced apart from first active region 109 via element isolation region 110.

Source electrode 106, drain electrode 107, and gate electrode 108 are disposed in first active region 109 and on second nitride semiconductor layer 104. First active region 109 includes source electrode 106, drain electrode 107, and gate electrode 108 in a plan view of semiconductor layer stacked body 105, and has first carrier layer 114A located in first nitride semiconductor layer 103. Source electrode 106 and drain electrode 107 are each a laminated body including, for example, at least one of titanium (Ti) and Al. Furthermore, gate electrode 108 is between source electrode 106 and drain electrode 107, and is a laminated body including, for example, at least one of Ti, Al, titanium nitride (TiN), palladium (Pd), platinum (Pt), gold (Au), and nickel (Ni). Note that although a short side of drain electrode 107 is inside first active region 109 in FIG. 1A and FIG. 2 and FIG. 3 described later, the short side of drain electrode 107 may coincide with an end of first active region 109 or may be beyond first active region 109.

Gate extraction electrode 111 is connected with gate electrode 108 across element isolation region 110. Gate extraction electrode 111 is, in a plan view of semiconductor layer stacked body 105, disposed in second active region 113 and located opposite the short side of drain electrode 107, so as to extract a potential of gate electrode 108.

Source extraction electrode 112 is spaced apart from gate extraction electrode 111 and is electrically connected with source electrode 106. In a plan view of semiconductor layer stacked body 105, source extraction electrode 112 is disposed in second active region 113 and adjacent to gate extraction electrode 111. Between gate extraction electrode 111 and source extraction electrode 112, first nitride semiconductor layer 103 has second carrier layer 114B. Second active region 113 is on an extension of a long-side direction of drain electrode 107 in the plan view, and has second carrier layer 114B located in first nitride semiconductor layer 103 via element isolation region 110 containing no carrier.

Element isolation region 110 is a region for spacing first active region 109 and second active region 113 apart from each other, and may be formed by ion implantation of, for example, at least one of boron (B) and argon (Ar), or may be a recess formed by etching.

As illustrated in the cross-sectional view in FIG. 1B, gate-drain capacitance Cgd is represented as the coupling capacitance between drain electrode 107 and gate extraction electrode 111 via the stacked structure from substrate 101 to second nitride semiconductor layer 104. Here, a potential of second carrier layer 114 that is in first nitride semiconductor layer 103 is substantially the same as a potential of source extraction electrode 112, or an intermediate potential of a potential of gate extraction electrode 111 and the potential of source extraction electrode 112. Therefore, gate-drain capacitance Cgd can be reduced.

Furthermore, since gate extraction electrode 111 is connected with second carrier layer 114B via second nitride semiconductor layer 104, the capacitance of second nitride semiconductor layer 104 is all given as gate-source capacitance Cgs.

Disposing gate extraction electrode 111, source extraction electrode 112, and second carrier layer 114B in second active region 113 as described above allows reducing Cgd as well as increasing Cgs due to parasitic Cgs given, which reduces Cgd/Cgs ratio. With this, self turn-on can be suppressed, and ESD tolerance between gate electrode 108 and source electrode 106 can also be improved.

More specifically, in semiconductor device 1 according to the present embodiment, second carrier layer 114B is provided under gate extraction electrode 111 opposed to drain electrode 107, and by setting the potential of second carrier layer 114B to a source potential, a gate-source capacitance Cgs is added from gate extraction electrode 111 through second carrier layer 114B, Conventionally, gate-drain capacitance Cgd was added by the drain electrode and the gate extraction electrode being opposed to each other. Unlike the conventional semiconductor device, in the present embodiment, second carrier layer 114B has the source potential, which produces an advantageous effect of shielding gate extraction electrode 111 and can reduce gate-drain capacitance Cgd. This makes it possible to reduce the Cgd/Cgs ratio and to suppress self turn-on. Furthermore, with Cgs added, electro-static discharge (ESD) tolerance between the gate electrode and the source electrode can also be improved.

Figure 16A:
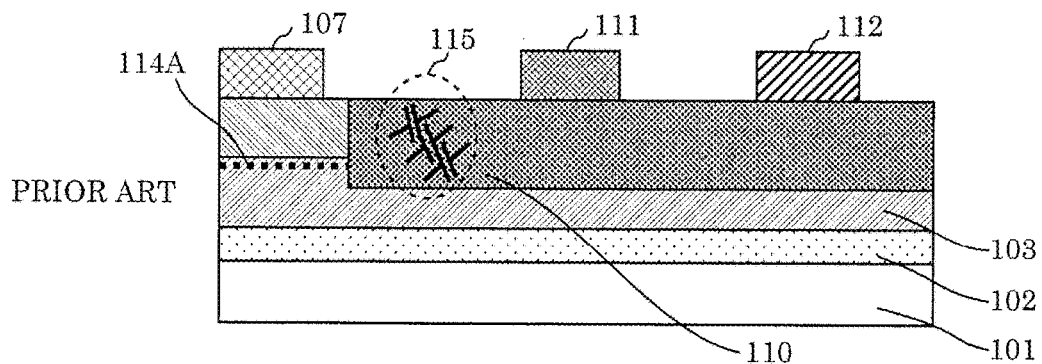
FIG. 16A is a capacitance reduction mechanism of the conventional semiconductor device.

FIG. 16A is a capacitance reduction mechanism of the conventional semiconductor device. As illustrated in FIG. 16A, conventionally, gate-drain capacitance Cgd 115 was added via first carrier layer 114A by drain electrode 107 and gate extraction electrode 111 being opposed to each other.

Figure 16B:
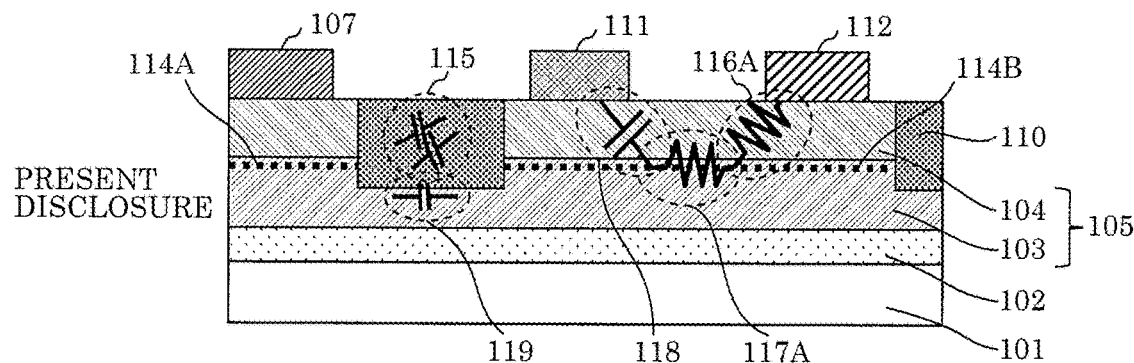
FIG. 16B is a capacitance reduction mechanism of the nitride semiconductor device according to Embodiment 1.

FIG. 16B is a capacitance reduction mechanism of semiconductor device 1 according to Embodiment 1. In the present embodiment, second carrier layer 114B has a source potential with respect to carrier layer resistance 117A via contact resistance 116A to carrier layer 114, which causes capacitive coupling of gate-source capacitance Cgs 118 between gate extraction electrode 111. As a result, gate-drain capacitance Cgd 115 is reduced and drain-source capacitance Cds 119 is increased. Since the increase in drain-source capacitance Cds 119 is a small amount with respect to the value of total Cds, there is no operational influence. On the other hand, the reduction in gate-drain capacitance Cgd 115 has a significant effect since the value of the total Cgd is small. A potential of second carrier layer 114B in second active region 113 may be a source potential, and a potential from source extraction electrode 112 through second carrier layer 114B in second active region 113 may be an intermediate potential between a potential of gate extraction electrode 111 and a potential of source extraction electrode 112 caused by capacitive coupling using an insulating film or coupling using Schottky junction.

Variation 1

Variation 1 of Embodiment 1 will be described below with reference to the Drawings.

Figure 2:
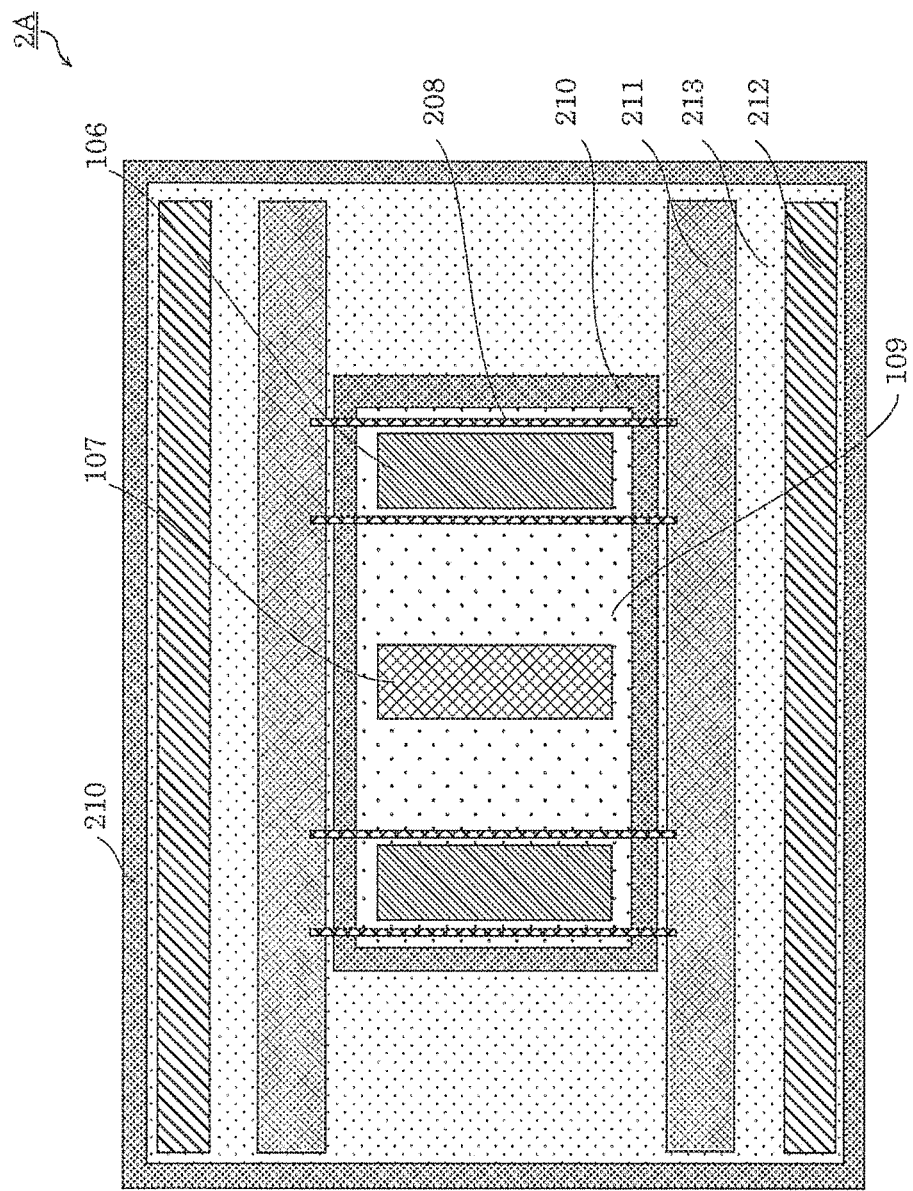
FIG. 2 is a schematic plan view of a semiconductor device according to Variation 1 of Embodiment 1.
Figure 3:
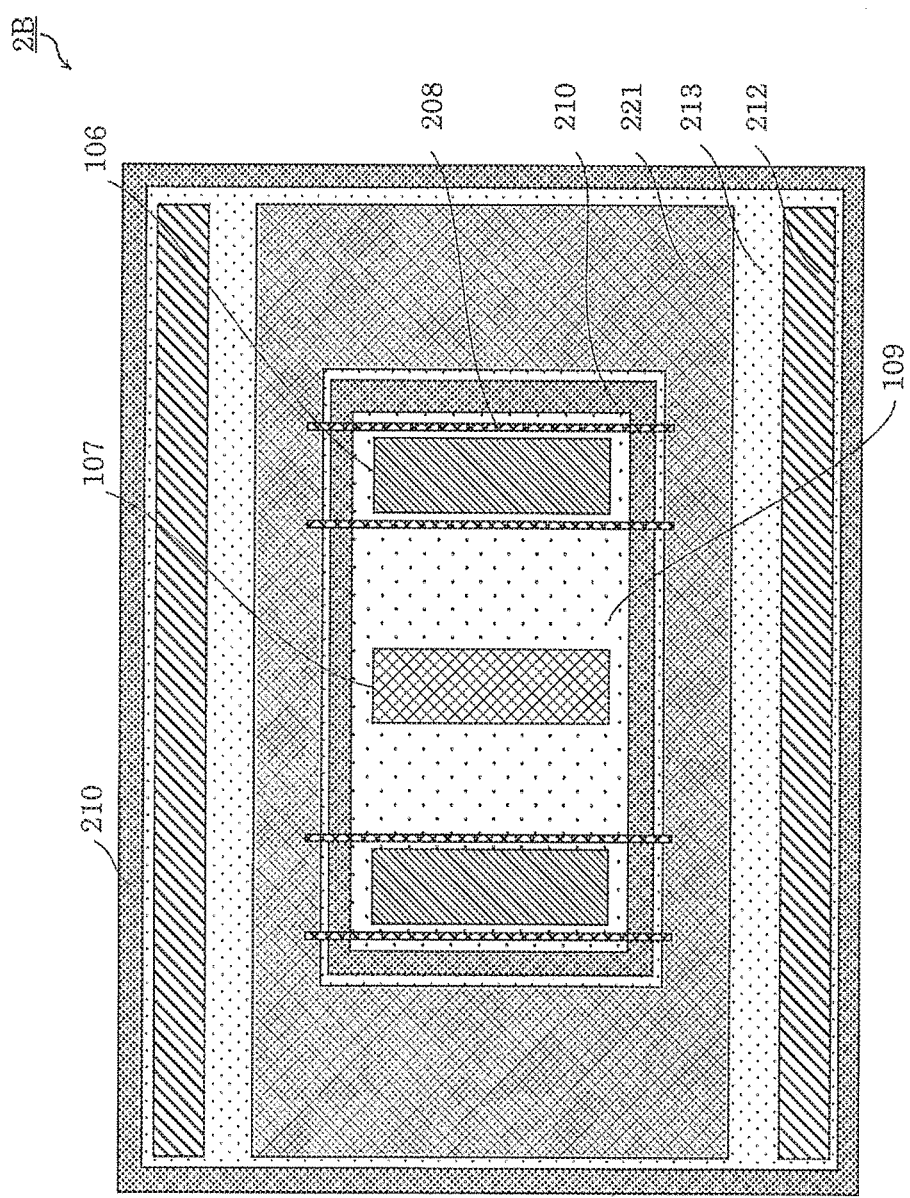
FIG. 3 is a schematic plan view of the semiconductor device according to Variation 1 of Embodiment 1.

FIG. 2 and FIG. 3 are each a schematic plan view of a semiconductor device according to Variation 1 of Embodiment 1. Note that their cross-sectional views are omitted since they are similar to those in Embodiment 1. Hereinafter, description on constituent elements which are the same as those in semiconductor device 1 according to Embodiment 1 will be omitted, and different constituent elements will be mainly described.

As illustrated in FIG. 2, terminal portion of gate electrode 208 is connected to gate extraction electrode 211, and second active region 213 encloses the periphery of first active region 109. As illustrated in FIG. 3, gate extraction electrode 221 may also enclose first active region 109.

With the structure in which second active region 213 encloses the periphery of first active region 109 as in semiconductor device 2A illustrated in FIG. 2 and semiconductor device 2B illustrated in FIG. 3, it is possible to reduce gate-drain capacitance Cgd in both terminal portions of gate electrode 208. Furthermore, a gate-source capacitance Cgs larger than that of semiconductor device 1 according to Embodiment 1 is given, which makes it possible to further reduce the Cgd/Cgs ratio and thus suppress self turn-on. In addition, with large gate-source capacitance Cgs given, ESD tolerance between gate electrode 208 and source electrode 106 can also be improved.

Furthermore, the semiconductor device according to the present embodiment may include the gate extraction electrodes configured as illustrated in FIG. 4 to FIG. 7 below.

Variation 2

Figure 4:
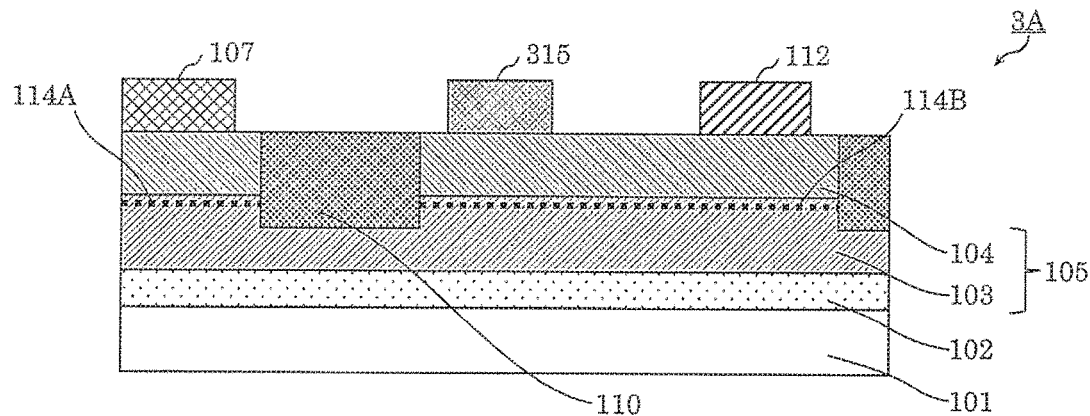
FIG. 4 is a schematic cross-sectional view of a semiconductor device according to Variation 2 of Embodiment 1.

FIG. 4 is a schematic cross-sectional view of semiconductor device 3A according to Variation 2 of Embodiment 1. As illustrated in FIG. 4, the gate extraction electrode according to the present variation may be first metal layer 315 which is in Schottky contact with second nitride semiconductor layer 104. First metal layer 315 includes a metal which is in Schottky contact with second nitride semiconductor layer 104, which is at least one of TiN, Ni, tungsten (W), and Al, for example.

Since the gate extraction electrode according to the present variation is in Schottky contact with second nitride semiconductor layer 104 and thus has a rectifying function, it is possible to isolate the gate extraction electrode and the source potential of second carrier layer 114B immediately under the gate extraction electrode.

Variation 3

Figure 5:
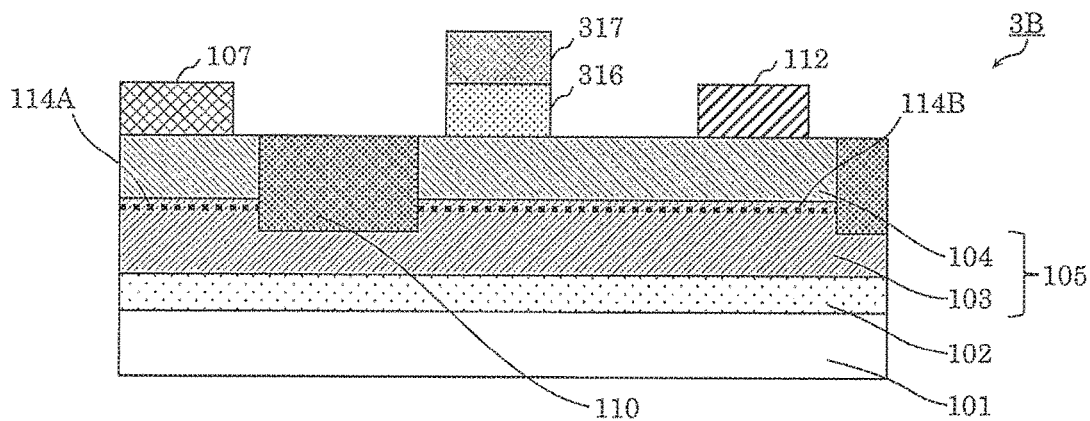
FIG. 5 is a schematic cross-sectional view f a semiconductor device according to Variation 3 of Embodiment 1.

FIG. 5 is a schematic cross-sectional view of semiconductor device 3B according to Variation 3 of Embodiment 1. As illustrated in FIG. 5, semiconductor device 3B further includes insulating film 316 on second nitride semiconductor layer 104. The gate extraction electrode according to the present variation may be second metal layer 317 on insulating film 316. Insulating film 316 includes, for example, at least one of silica ($SiO_2$), silicon nitride ($Si_3N_1$), and aluminum nitride (AlN).

Since the gate extraction electrode according to the present variation has an insulating function with respect to second nitride semiconductor layer 104, it is possible to reduce gate current Ig that leaks to the source extraction electrode.

Variation 4

Figure 6:
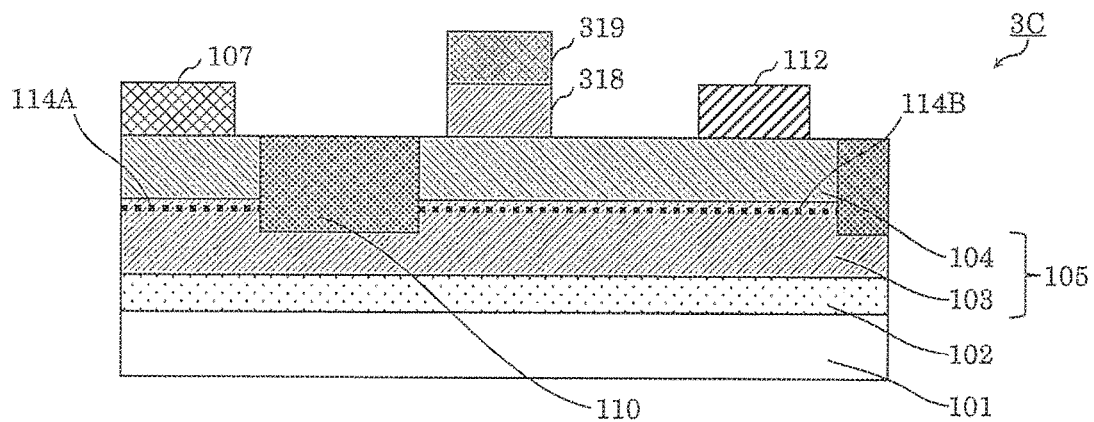
FIG. 6 is a schematic cross-sectional view of a semiconductor device according to Variation 4 of Embodiment 1.

FIG. 6 is a schematic cross-sectional view of semiconductor device 3C according to Variation 4 of Embodiment 1. As illustrated in FIG. 6, semiconductor device 3C further includes third nitride semiconductor layer 318 on second nitride semiconductor layer 104. The gate extraction electrode according to the present variation may be third metal layer 319 which is on third nitride semiconductor layer 318 and in ohmic contact with third nitride semiconductor layer 318. Third metal layer 319 includes a metal which is in ohmic contact with third nitride semiconductor layer 318, such as Pd, for example.

Since the gate extraction electrode according to the present variation is in contact with second nitride semiconductor layer 104 via third nitride semiconductor layer 318, it is possible to modulate gate current Ig that leaks to the source extraction electrode.

Variation 5

Figure 7:
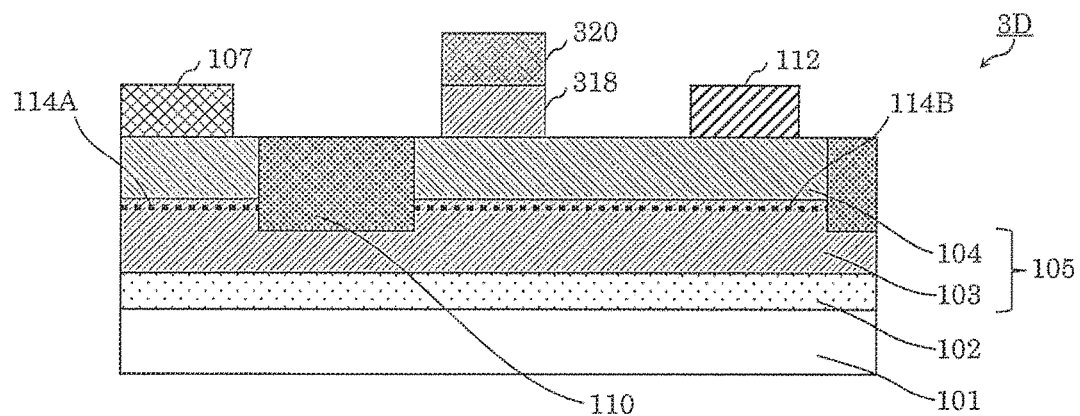
FIG. 7 is a schematic cross-sectional view of a semiconductor device according to Variation 5 of Embodiment 1.

FIG. 7 is a schematic cross-sectional view of semiconductor device 3D according to Variation 5 of Embodiment 1. As illustrated in FIG. 7, semiconductor device 3D further includes third nitride semiconductor layer 318 on second nitride semiconductor layer 104. The gate extraction electrode according to the present variation may be fourth metal layer 320 which is on third nitride semiconductor layer 318 and in Schottky contact with third nitride semiconductor layer 318. Fourth metal layer 320 includes a metal which is in Schottky contact with third nitride semiconductor layer 318, for example, at least one of Ni, TiN, tungsten silicide (WSi), and W.

Since the gate extraction electrode according to the present variation is in contact with second nitride semiconductor layer 104 via third nitride semiconductor layer 318, it is possible to modulate gate current Ig that leaks to the source extraction electrode.

Furthermore, the semiconductor device according to the present embodiment may include the source extraction electrodes configured as illustrated in FIG. 8 to FIG. 13 below.

Variation 6

Figure 8:
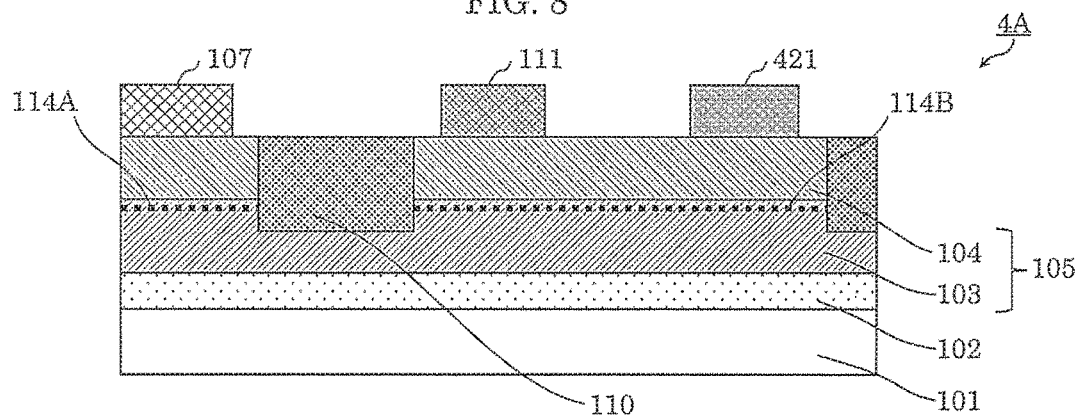
FIG. 8 is a schematic cross-sectional view of a semiconductor device according to Variation 6 of Embodiment 1.

FIG. 8 is a schematic cross-sectional view of semiconductor device 4A according to Variation 6 of Embodiment 1. As illustrated in FIG. 8, the source extraction electrode according to the present variation may be fifth metal layer 421 which is in ohmic contact with second nitride semiconductor layer 104. Fifth metal layer 421 includes a metal which is in ohmic contact with second nitride semiconductor layer 104, for example, at least one of Ti and Al.

Since the source extraction electrode according to the present variation is in ohmic contact with second nitride semiconductor layer 104, it is possible to fix a potential of second carrier layer 114B immediately under the gate extraction electrode to the source potential.

Variation 7

Figure 9:
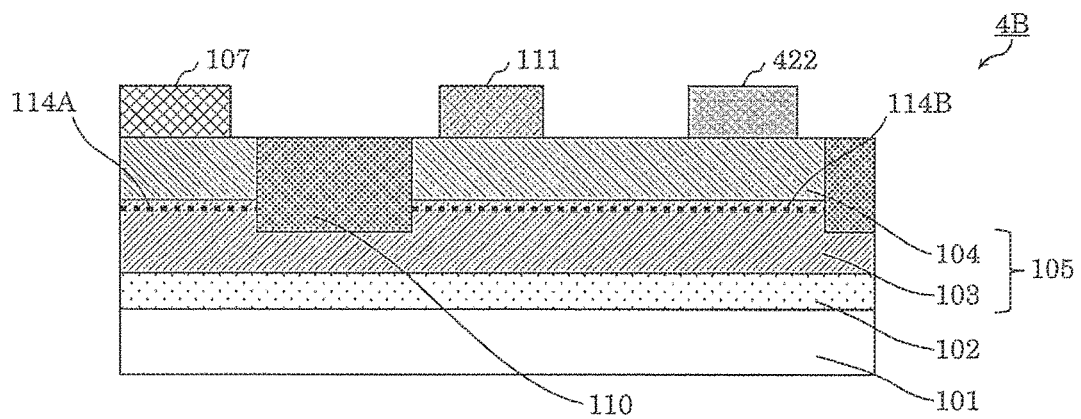
FIG. 9 is a schematic cross-sectional view of a semiconductor device according to Variation 7 of Embodiment 1.

FIG. 9 is a schematic cross-sectional view of semiconductor device 4B according to Variation 7 of Embodiment 1. As illustrated in FIG. 9, the source extraction electrode according to the present variation may be sixth metal layer 422 which is in Schottky contact with second nitride semiconductor layer 104. Sixth metal layer 422 includes a metal which is in Schottky contact with second nitride semiconductor layer 104, for example, at least one of TiN, Ni, W, and Al.

Since the source extraction electrode according to the present variation is in Schottky contact with second nitride semiconductor layer 104, it is possible to reduce gate current 1g flowing in the source extraction electrode.

Variation 8

Figure 10:
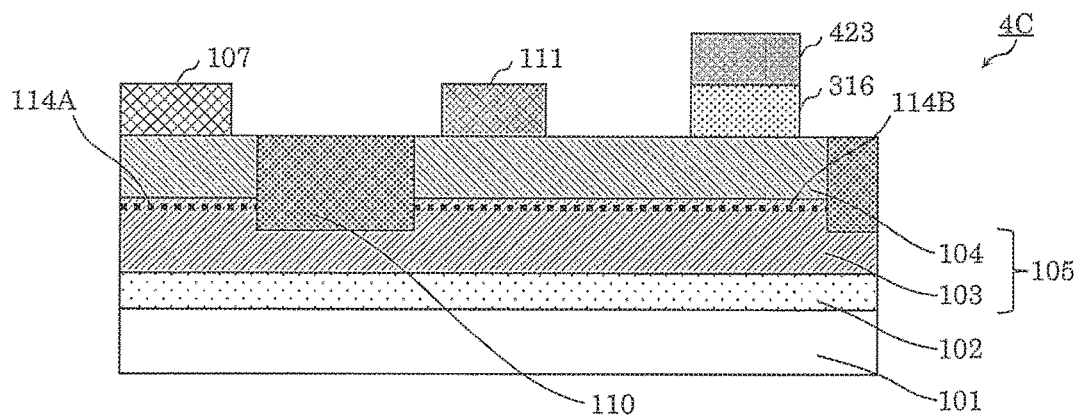
FIG. 10 is a schematic cross-sectional view of a semiconductor device according to Variation 8 of Embodiment 1.

FIG. 10 is a schematic cross-sectional view of semiconductor device 4C according to Variation 8 of Embodiment 1. As illustrated in FIG. 10, semiconductor device 4C further includes insulating film 316 on second nitride semiconductor layer 104. The source extraction electrode according to the present variation may be seventh metal layer 423 on insulating film 316. Insulating film 316 includes, for example at least one of $SiO_2$, $Si_3N_4$, and AlN.

Since the source extraction electrode according to the present variation has an insulating function with respect to second nitride semiconductor layer 104, it is possible to reduce gate current Ig that leaks to the source extraction electrode.

Variation 9

Figure 11:
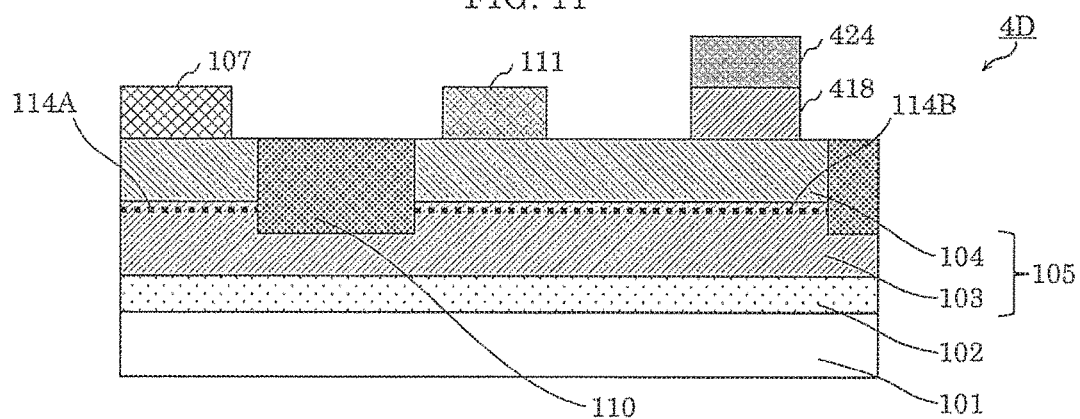
FIG. 11 is a schematic cross-sectional view of a semiconductor device according to Variation 9 of Embodiment 1.

FIG. 11 is a schematic cross-sectional view of semiconductor device 4D according to Variation 9 of Embodiment 1, As illustrated in FIG. 11, semiconductor device 4D further includes fourth nitride semiconductor layer 418 on second nitride semiconductor layer 104. The source extraction electrode according to the present variation may be eighth metal layer 424 on fourth nitride semiconductor layer 418. Eighth metal layer 424 includes a metal that is in ohmic contact with fourth nitride semiconductor layer 418, such as Pd, for example. Alternatively, eighth metal layer 424 includes a metal which is in Schottky contact with fourth nitride semiconductor layer 418, for example, at least one of Ni, TiN, WSi, and W.

Since the source extraction electrode according to the present variation is in contact with second nitride semiconductor layer 104 via fourth nitride semiconductor layer 418, it is possible to further reduce gate current Ig that leaks to the source extraction electrode.

Variation 10

Figure 12:
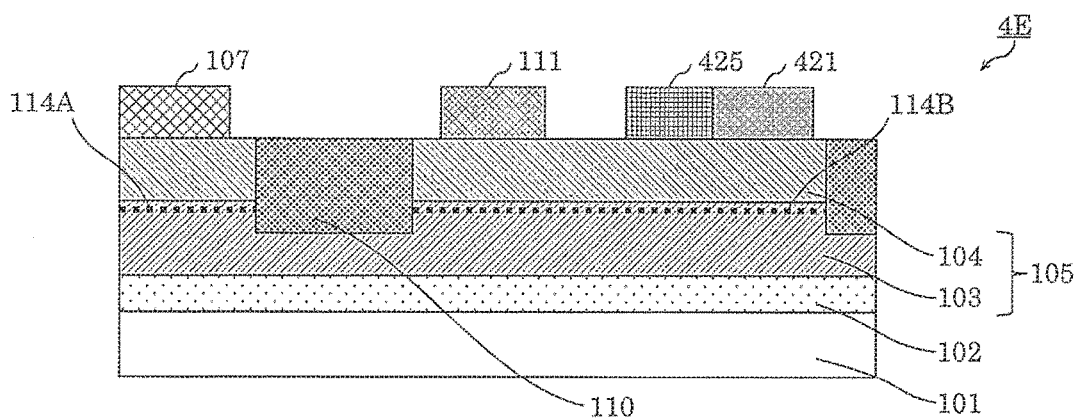
FIG. 12 is a schematic cross-sectional view of a semiconductor device according to Variation 10 of Embodiment 1.

FIG. 12 is a schematic cross-sectional view of semiconductor device 4E according to Variation 10 of Embodiment 1. As illustrated in FIG. 12, semiconductor device 4E may further include a second source extraction electrode between the source extraction electrode (e.g., fifth metal layer 421) and gate extraction electrode 111. Here, the second source extraction electrode according to the present variation may be ninth metal layer 425 which is in Schottky contact with second nitride semiconductor layer 104. Ninth metal layer 425 includes a metal which is in Schottky contact with second nitride semiconductor layer 104, for example at least one of TiN, Ni, W, and Al.

Since the second source extraction electrode according to the present variation is an electrode which is in Schottky contact with second nitride semiconductor 104, it is possible to clamp an excessive gate voltage that is equal to or larger than a threshold voltage of second semiconductor layer 104 while maintaining the potential of second carrier layer 114B at the source potential, and it is also possible to reduce gate current Ig.

Variation 11

Figure 13:
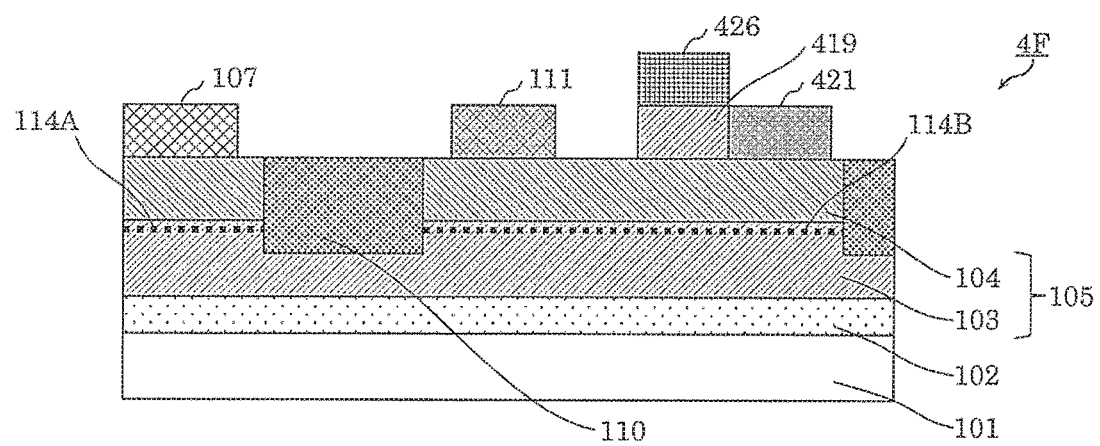
FIG. 13 is a schematic cross-sectional view of a semiconductor device according to Variation 11 of Embodiment 1.

FIG. 13 is a schematic cross-sectional view of semiconductor device 4F according to Variation 11 of Embodiment 1. As illustrated in FIG. 13, semiconductor device 4F may further include: a second source extraction electrode between the source extraction electrode (e.g. fifth metal layer 421) and gate extraction electrode 111; and fifth nitride semiconductor layer 419 on second semiconductor layer 104. Here, the second source extraction electrode according to the present variation may be tenth metal layer 426 on fifth nitride semiconductor layer 419. Tenth metal layer 426 includes a metal which is in Schottky contact with fifth nitride semiconductor layer 419, for example, at least one of Ni, TiN, WSi, and W.

Regarding the second source extraction electrode according to the present variation, by providing fifth nitride semiconductor layer 419 between the gate extraction electrode and the source extraction electrode, it is possible to clamp an excessive gate voltage that is equal to or larger than the threshold voltage of second nitride semiconductor layer 104 while maintaining the potential of second carrier layer 114B at the source potential, and it is also possible to reduce gate current Ig.

Note that, in the present embodiment and the variations, third nitride semiconductor layer 318, fourth nitride semiconductor layer 418, and fifth nitride semiconductor layer 419 may be p-type nitride semiconductor layers. This makes it possible to reduce leakage current from the gate extraction electrode to the source extraction electrode. Note that third nitride semiconductor layer 318, fourth nitride semiconductor layer 418, and fifth nitride semiconductor layer 419 may be undoped nitride semiconductor layers into which no impurities are intentionally introduced.

Embodiment 2

Hereinafter, semiconductor device 5 according to Embodiment 2 will be described with reference to the Drawings.

Figure 14:
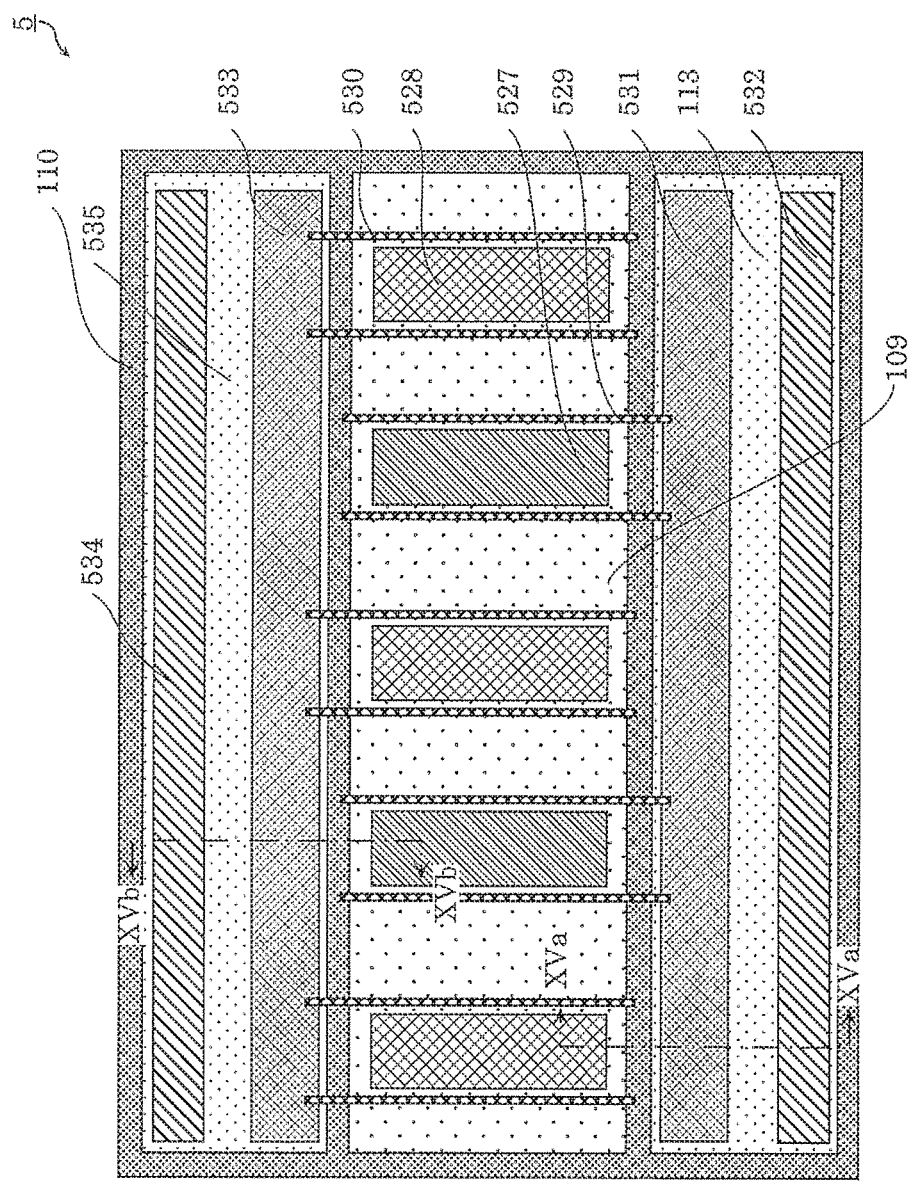
FIG. 14 is a schematic plan view of a semiconductor device according to Embodiment 2.
Figure 15A:
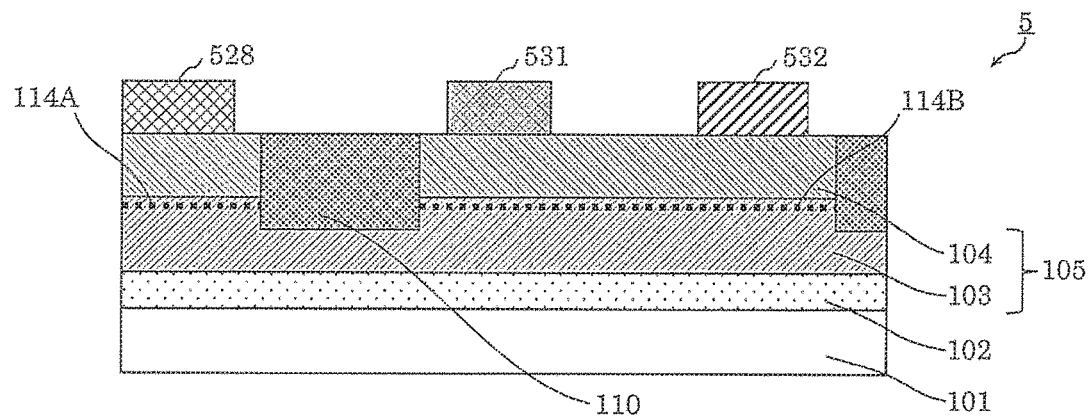
FIG. 15A is a first schematic cross-sectional view of the nitride semiconductor device according to Embodiment 2.
Figure 15B:
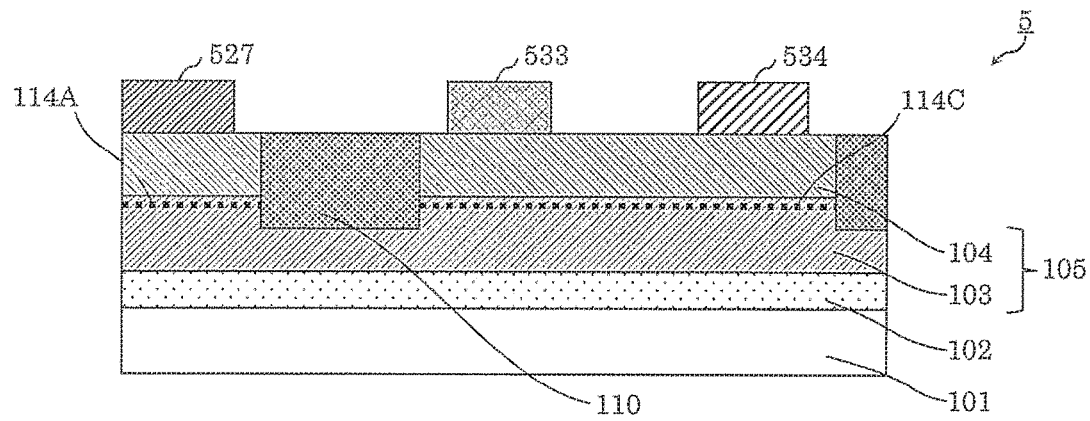
FIG. 15B is a second schematic cross-sectional view of the nitride semiconductor device according to Embodiment 2.

FIG. 14 is a schematic plan view of semiconductor device 5 according to Embodiment 2. Furthermore, FIG. 15A is a first schematic cross-sectional view of semiconductor device 5 according to Embodiment 2, and FIG. 15B is a second schematic cross-sectional view of semiconductor device 5 according to Embodiment 2. Specifically, FIG. 15A illustrates a cross-sectional view at an XVa-XVa line in FIG. 14, and FIG. 15B illustrates a cross-sectional view at an XVb-XVb line in FIG. 14.

As illustrated in FIG. 14, FIG. 15A, and FIG. 15B, semiconductor device 5 according to the present embodiment includes substrate 101, buffer layer 102, first nitride semiconductor layer 103, second nitride semiconductor layer 104, first ohmic electrode 527 and second ohmic electrode 528, first gate electrode 529 and second gate electrode 530, first gate extraction electrode 531 and second gate extraction electrode 533, and first extraction electrode 532 and second extraction electrode 534.

Substrate 101, buffer layer 102, first nitride semiconductor layer 103, and second nitride semiconductor layer 104 are the same as those in Embodiment 1, and the description thereof is omitted.

As illustrated in FIG. 14, in a plan view of semiconductor layer stacked body 105, semiconductor device 5 includes first active region 109 having a transistor function, second active region 113 spaced apart from first active region 109 via element isolation region 110, and third active region 535 spaced apart from first active region 109 via element isolation region 110.

First ohmic electrode 527, second ohmic electrode 528, first gate electrode 529, and second gate electrode 530 are disposed in first active region 109 and on second nitride semiconductor layer 104. First gate electrode 529 and second gate electrode 530 are spaced apart from each other on semiconductor layer stacked body 105 in the plan view. First active region 109 includes first ohmic electrode 527, second ohmic electrode 528, first gate electrode 529, and second gate electrode 530 in a plan view of semiconductor layer stacked body 105, and has first carrier layer 114A disposed in first nitride semiconductor layer 103.

First ohmic electrode 527 and second ohmic electrode 528 are each a stacked body including, for example, at least one of Ti and Al. Although short sides of first ohmic electrode 527 and second ohmic electrode 528 are located inside first active region 109 in FIG. 14, the short sides may coincide with the end of first active region 109 or exceed first active region 109.

Furthermore, first gate electrode 529 is disposed between first ohmic electrode 527 and second ohmic electrode 528 and in the vicinity of first ohmic electrode 527. Furthermore, second gate electrode 530 is disposed between first ohmic electrode 527 and second ohmic electrode 528 and in the vicinity of second ohmic electrode 528. First ohmic electrode 527 is disposed on a side of first gate electrode 529 opposite second gate electrode 530 and is spaced apart from first gate electrode 529 in the plan view. Furthermore, second ohmic electrode 528 is disposed on a side of second gate electrode 530 opposite first gate electrode 529 and is spaced apart from second gate electrode 528 in the plan view. First gate electrode 529 and second gate electrode 530 are each a stacked body including, for example, at least one of Ti, Al, TiN, Pd, Pt, Au, and Ni.

First gate extraction electrode 531 is connected with first gate electrode 529 across element isolation region 110, and second gate extraction electrode 533 is connected with second gate electrode 530 across element isolation region 110, First gate extraction electrode 531 is, in a plan view of semiconductor layer stacked body 105, an electrode which is disposed in second active region 113 and located opposite the short side of second ohmic electrode 528 in order to extract the potential of first gate electrode 529. Furthermore, second gate extraction electrode 533 is, in the plan view of semiconductor layer stacked body 105, an electrode which is disposed in third active region 535 and located opposite the short side of first ohmic electrode 527 in order to extract the potential of second gate electrode 530.

First extraction electrode 532 is spaced apart from first gate extraction electrode 531, and is electrically connected with first ohmic electrode 527. First extraction electrode 532 is an electrode which is disposed in second active region 113 so as to be adjacent to first gate extraction electrode 531. Between first extraction electrode 532 and first gate extraction electrode 531, first nitride semiconductor layer 103 has second carrier layer 114B. Second active region 113 has, in the plan view, second carrier layer 114B which is located on an extension of a long side direction of second ohmic electrode 528 and is located in first nitride semiconductor layer 103 via element isolation region 110 containing no carrier.

Second extraction electrode 534 is spaced apart from second gate extraction electrode 533 and is electrically connected with second ohmic electrode 528, Second extraction electrode 534 is an electrode which is disposed in third active region 535 so as to be adjacent to second gate extraction electrode 533. Between second extraction electrode 534 and second gate extraction electrode 533, first nitride semiconductor layer 103 has third carrier layer 114C, Third active region 535 is disposed on an extension of a long-side direction of first ohmic electrode 527 and in first nitride semiconductor layer 103 via element isolation region 110, in the plan view.

Element isolation region 110 is a region for: spacing first active region 109 and second active region 113 apart from each other; and spacing first active region 109 and third active region 535 apart from each other, and may be formed by ion implantation of, for example, at least one of B and Ar, or may be a recess formed by etching.

As illustrated in the sectional views of FIG. 15A and FIG. 15B, here, the capacitance for use in coupling of first ohmic electrode 527 and first gate electrode 529 with second gate extraction electrode 533 via substrate 101 is defined as Cgg. Taking the parasitic capacitance coupled to each of first gate extraction electrode 531 and second gate extraction electrode 533 via substrate 101 into consideration, a potential of third carrier layer 114C is substantially the same as a potential of second extraction electrode 534 or is an intermediate potential between a potential of second gate extraction electrode 533 and the potential of second extraction electrode 534, which makes it possible to reduce capacitance Cgg. Note that second extraction electrode 534 may have the same potential as that of second ohmic electrode 528.

Furthermore, the capacitance for use in coupling of second ohmic electrode 528 and second gate electrode 530 with first gate extraction electrode 531 via substrate 101 is defined as Cgg. A potential of second carrier layer 114B is substantially the same as a potential of first extraction electrode 532 or is an intermediate potential between a potential of first gate extraction electrode 531 and the potential of first extraction electrode 532, which makes it possible to reduce capacitance Cgg. Note that first extraction electrode 532 may have the same potential as that of first ohmic electrode 527.

In this specification, when a single-gate transistor is used as in Embodiment 1, the feedback capacitance is represented by Cgd. On the other hand, when a double-gate transistor is used as in the present embodiment, feedback capacitance is represented by gate-gate capacitance Cgg which is a capacitance between (i) first gate electrode 529 and first gate extraction electrode 531 and (ii) second gate electrode 530 and second gate extraction electrode 533.

Furthermore, first gate extraction electrode 531 is connected to second carrier layer 114B via second nitride semiconductor layer 104. Second carrier layer 114B has the same potential as that of first extraction electrode 532, and the capacitance of second nitride semiconductor layer 104 is all given as capacitance Cgs1 which is the capacitance between first gate extraction electrode 531 and first extraction electrode 532.

Furthermore, second gate extraction electrode 533 is connected to third carrier layer 114C via second nitride semiconductor layer 104. Third carrier layer 1140 has the same potential as that of second extraction electrode 534, and the capacitance of second nitride semiconductor layer 104 is all given as capacitance Cgs2 which is the capacitance between second gate extraction electrode 533 and second extraction electrode 534.

Note that first gate extraction electrode 531 and second gate extraction electrode 533 in the present embodiment may have the same structure as those in Embodiment 1 and the variations. Furthermore, first extraction electrode 532 and second extraction electrode 534 may have the same structure as those in Embodiment 1 and the variations.

Specifically, with the above-described structure in which: first gate extraction electrode 531, first extraction electrode 532, and second carrier layer 114B are disposed in second active region 113; and second gate extraction electrode 533, second extraction electrode 534, and third carrier layer 1140 are disposed in third active region 535, it is possible to reduce the Cgg/Cgs1 ratio when being viewed from first gate electrode 529 side and the Cgg/Cgs2 ratio when being viewed from second gate electrode 530 side. Therefore, self turn-on can be suppressed also in a double-gate transistor. In addition, with the parasitic capacitances Cgs1 and Cgs2 given to the respective gate electrodes, it is possible to improve the ESD tolerance between first gate electrode 529 and first ohmic electrode 527 and the ESD tolerance between second gate electrode 530 and second ohmic electrode 528.

Figure 17A:
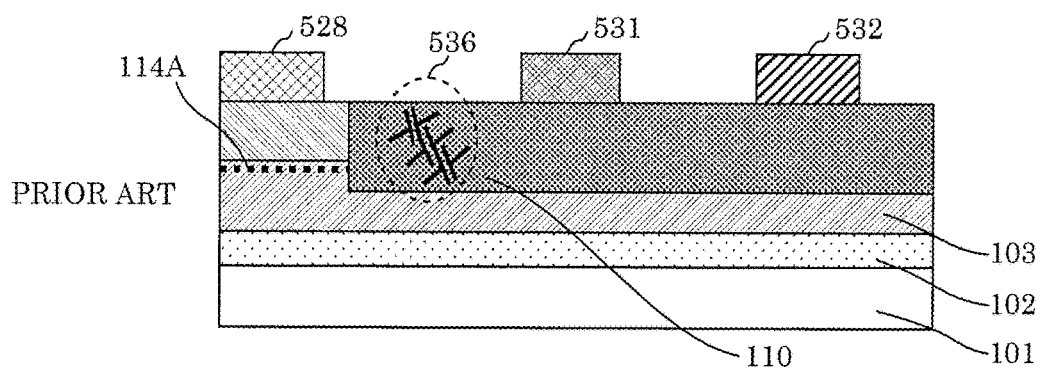
FIG. 17A is a first capacitance reduction mechanism of the conventional semiconductor device.
Figure 18A:
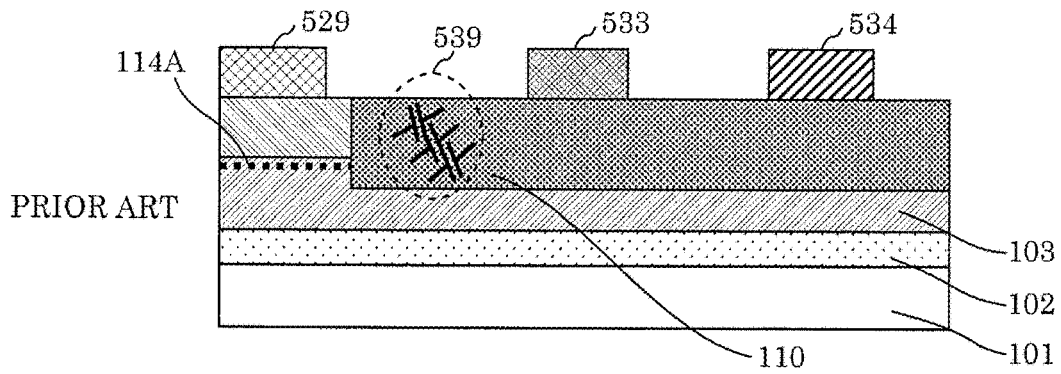
FIG. 18A is a first capacitance reduction mechanism of the conventional semiconductor device.

FIG. 17A and FIG. 18A each illustrates a first capacitance reduction mechanism of the conventional semiconductor device. As illustrated in FIG. 17A and FIG. 18A, conventionally, second ohmic electrode 528 and first gate extraction electrode 531 are opposed to each other, so that first-gate-extraction-electrode-second-ohmic-electrode capacitance 536 is added via first carrier layer 114A.

Figure 17B:
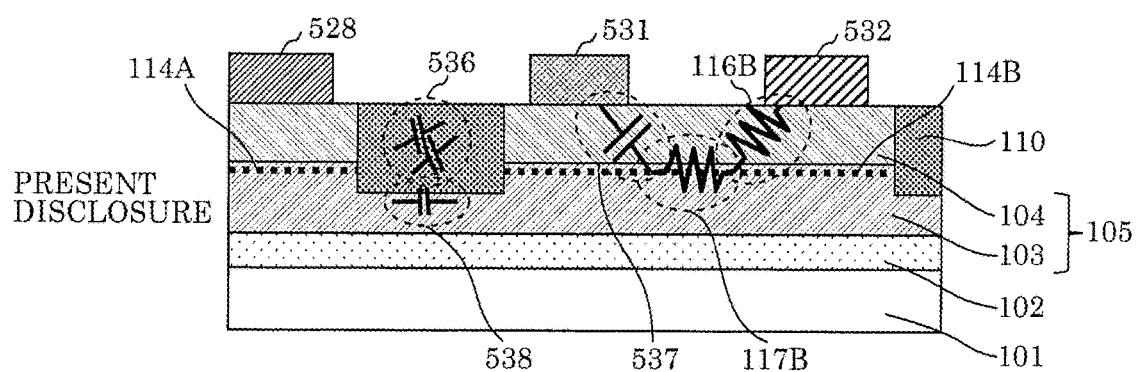
FIG. 17B is a first capacitance reduction mechanism of the nitride semiconductor device according to Embodiment 2.
Figure 18B:
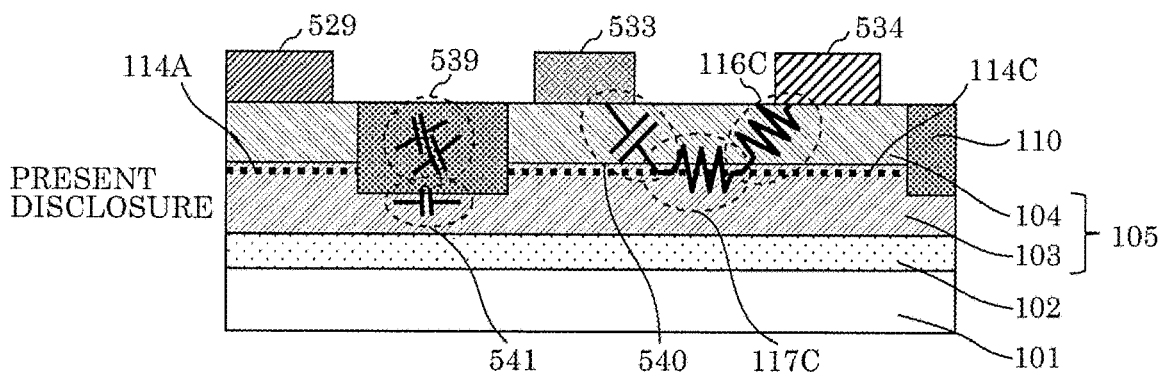
FIG. 18B is the first capacitance reduction mechanism of the nitride semiconductor device according to Embodiment 2.
Figure 19:
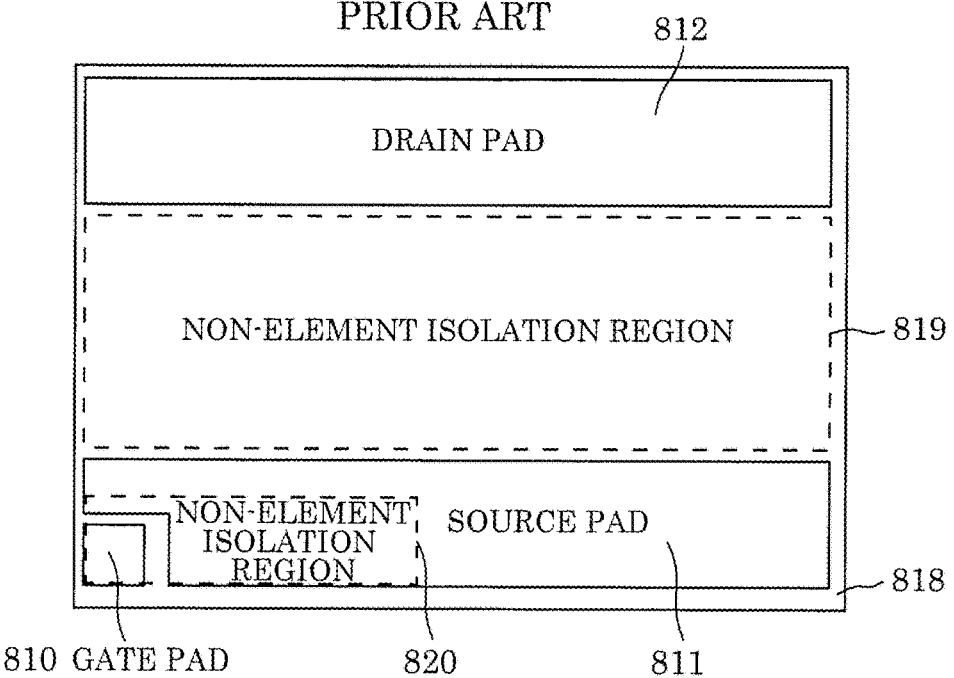
FIG. 19 is a schematic plan view of the semiconductor device described in Japanese Unexamined Patent Application Publication No. 2012-119625.

FIG. 17B and FIG. 18B each illustrates a first capacitance reduction mechanism of semiconductor device 5 according to Embodiment 2. In the present embodiment, second carrier layer 114B has the potential of first extraction electrode 532 with respect to carrier layer resistance 117B via contact resistance 116B to carrier layer 114, which causes capacitive coupling of first-gate-extraction-electrode-first-extraction-electrode capacitance 537 between first gate extraction electrode 531. As a result, first-gate-extraction-electrode-second-ohmic-electrode capacitance 536 decreases and second-ohmic-electrode-first-extraction-electrode capacitance 538 increases. Since the increase in second-ohmic-electrode-first-extraction-electrode capacitance 538 is a small amount with respect to the total second-ohmic-electrode-first-extraction-electrode capacitance, there is no operational influence. On the other hand, reduction in first-gate-extra electrode-second-ohmic-electrode capacitance 536 has a significant effect because the value of total first-gate-extraction-electrode-second-ohmic-electrode capacitance is small. A potential of second carrier layer 114B in second active region 113 may be a potential of first extraction electrode 532, and a potential from first extraction electrode 532 through second carrier layer 114B in second active region 113 may be an intermediate potential between the potential of first gate extraction electrode 531 and the potential of first extraction electrode 532 caused by capacitive coupling using an insulating film or coupling using Schottky junction.

Other Embodiments

The semiconductor device according to the present disclosure has been described based on Embodiments 1 and 2 and the variations thereof. However, the semiconductor device according to the present disclosure is not limited to Embodiments 1 and 2 and the variations thereof. Other embodiments achieved by combining arbitrary constituent elements in Embodiments 1 and 2 and the variations thereof, variations obtained by applying various modifications conceived by those skilled in the art to Embodiments 1 and 2 and the variations thereof within a scope that does not deviate from the essence of the present disclosure, and various devices including the semiconductor device according to the present disclosure are also included in the present disclosure.

INDUSTRIAL APPLICABILITY

The semiconductor device according to the present disclosure is particularly useful as a power transistor used for an inverter, a power conditioner, a power supply circuit, and the like.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A semiconductor device, comprising:
a substrate;
a semiconductor layer stacked body including a first nitride semiconductor layer above the substrate and a second nitride semiconductor layer which is on the first nitride semiconductor layer and has a band gap wider than a band gap of the first nitride semiconductor layer;
a gate electrode on the semiconductor layer stacked body;
a source electrode and a drain electrode located on opposite sides of the gate electrode and spaced apart from the gate electrode in a plan view of the semiconductor layer stacked body;
a first active region which has a first carrier layer located in the first nitride semiconductor layer, the source electrode, the drain electrode and the gate electrode being disposed in the first active region in the plan view;
a second active region which is on an extension of a long side of the drain electrode in the plan view, and has a second carrier layer located in the first nitride semiconductor layer, the second carrier layer being separated from the first carrier layer by an element isolation region containing no carrier;
a gate extraction electrode located opposite a short side of the drain electrode and disposed in the second active region in the plan view, and electrically connected with the gate electrode; and
a source extraction electrode directly on the semiconductor layer stacked body and disposed in the second active region in the plan view and electrically connected with the source electrode.

2. The semiconductor device according to claim 1,
wherein, in the plan view, no conductor is disposed on the semiconductor layer stacked body in a region between the drain electrode and the gate extraction electrode, and
in a cross-sectional view of the semiconductor layer stacked body, the drain electrode and the gate extraction electrode are opposed to each other having the region therebetween.

3. The semiconductor device according to claim 1,
wherein, in the plan view, no conductor is disposed on the semiconductor layer stacked body in a region between the drain electrode and the gate extraction electrode, and
in a cross-sectional view of the semiconductor layer stacked body, the second carrier layer is immediately under the gate extraction electrode.

4. The semiconductor device according to claim 1,
wherein, in a cross-sectional view of the semiconductor layer stacked body, the second carrier layer extends from a region under the source extraction electrode toward a side of the drain electrode beyond a region under the gate extraction electrode.

5. The semiconductor device according to claim 1,
wherein the gate extraction electrode is a first metal layer which is in Schottky contact with the second nitride semiconductor layer.

6. The semiconductor device according to claim 1, further comprising:
an insulating film on the second nitride semiconductor layer,
wherein the gate extraction electrode is a second metal layer on the insulating film.

7. The semiconductor device according to claim 1, further comprising:
a third nitride semiconductor layer on the second nitride semiconductor layer,
wherein the gate extraction electrode is a third metal layer which is on the third nitride semiconductor layer and in ohmic contact with the third nitride semiconductor layer.

8. The semiconductor device according to claim 7,
wherein the third nitride semiconductor layer is a p-type nitride semiconductor layer.

9. The semiconductor device according to claim 7,
wherein the source extraction electrode is a fifth metal layer which is in ohmic contact with the second nitride semiconductor layer.

10. The semiconductor device according to claim 9, further comprising:
a second source extraction electrode between the source extraction electrode and the gate extraction electrode; and
a fifth nitride semiconductor layer on the second nitride semiconductor layer,
wherein the second source extraction electrode is a tenth metal layer on the fifth nitride semiconductor layer.

11. The semiconductor device according to claim 10,
wherein the fifth nitride semiconductor layer is a p-type nitride semiconductor layer.

12. The semiconductor device according to claim 9, further comprising:
a second source extraction electrode between the source extraction electrode and the gate extraction electrode,
wherein the second source extraction electrode is a ninth metal layer which is in Schottky contact with the second nitride semiconductor layer.

13. The semiconductor device according to claim 7,
wherein the source extraction electrode is a sixth metal layer which is in Schottky contact with the second nitride semiconductor layer.

14. The semiconductor device according to claim 7, wherein the semiconductor layer stacked body further includes:
a fourth nitride semiconductor layer on the second nitride semiconductor layer,
wherein the source extraction electrode is an eighth metal layer on the fourth nitride semiconductor layer.

15. The semiconductor device according to claim 14,
wherein the fourth nitride semiconductor layer is a p-type nitride semiconductor layer.

16. The semiconductor device according to claim 1, further comprising:
a third nitride semiconductor layer on the second nitride semiconductor layer,
wherein the gate extraction electrode is a fourth metal layer which is on the third nitride semiconductor layer and in Schottky contact with the third nitride semiconductor layer.

17. The semiconductor device according to claim 16,
wherein the third nitride semiconductor layer is a p-type nitride semiconductor layer.

18. The semiconductor device according to claim 1,
wherein, in the plan view, the second active region encloses the first active region via the element isolation region.

19. The semiconductor device according to claim 1,
wherein, the source extraction electrode is in ohmic contact with second nitride semiconductor layer.

* * * * *